(12) United States Patent
Chen et al.

(10) Patent No.: US 11,533,062 B1
(45) Date of Patent: Dec. 20, 2022

(54) NON-UNIFORM SAMPLING PHOTONIC ANALOG-TO-DIGITAL CONVERTER

(71) Applicant: Rockwell Collins, Inc., Cedar Rapids, IA (US)

(72) Inventors: Wenlu Chen, Clarksville, MD (US); Oliver S. King, Frederick, MD (US); Han Chi Hsieh, Gaithersburg, MD (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 17/361,677

(22) Filed: Jun. 29, 2021

(51) Int. Cl.
*H03M 1/00* (2006.01)
*H03M 7/00* (2006.01)
*H03M 1/12* (2006.01)
*G02F 7/00* (2006.01)

(52) U.S. Cl.
CPC .............. *H03M 7/008* (2013.01); *G02F 7/00* (2013.01); *H03M 1/12* (2013.01)

(58) Field of Classification Search
CPC ............ H03M 7/008; H03M 1/12; G02F 7/00
USPC ........................................................ 341/137
See application file for complete search history.

(56) References Cited

U.S. PATENT DOCUMENTS

| 7,376,349 B2 | 5/2008 | Ionov et al. |
| 8,902,095 B2 | 12/2014 | Kanter et al. |
| 8,928,510 B1 | 1/2015 | Zanoni et al. |
| 8,953,950 B2 | 2/2015 | Nazarathy et al. |
| 9,329,453 B1 | 5/2016 | Hsieh |
| 9,450,597 B1 | 9/2016 | Ahmed et al. |
| 9,450,696 B2 | 9/2016 | Shaver et al. |

(Continued)

FOREIGN PATENT DOCUMENTS

| EP | 3136624 B1 | 12/2018 |
| EP | 3577847 B1 | 11/2020 |

(Continued)

OTHER PUBLICATIONS

McKenna, Timothy P. et al., "Wideband Photonic Compressive Sampling System", Journal of Lightwave Technology, vol. 34, No. 11, Jun. 1, 2016, 8 pages.

*Primary Examiner* — Jean B Jeanglaude
(74) *Attorney, Agent, or Firm* — Suiter Swantz pc llo

(57) ABSTRACT

A non-uniform sampling pADC is disclosed. The pADC may include an optical pulse source configured to generate uniform optic pulses. The pADC may include a non-uniform sampling system. The non-uniform sampling system may include an inter-pulse timing modulation sub-system configured to convert the uniform optic pulses into non-uniform optic pulses. The non-uniform sampling system may include a timing control sub-system configured to control the timing of the optical pulse source. The pADC may include an optical modulator configured to modulate the non-uniform optical pulses. The pADC may include a photodetector configured to convert the modulated non-uniform optic pulses into electronic pulses. The pADC may include a pulse capture assembly configured to capture a pulse amplitude of the electronic pulses and generate sampled radio frequency output pulses. The pADC may include a quantizer configured to quantize the sampled radio frequency output pulses and generate digital radio frequency output signals.

15 Claims, 9 Drawing Sheets

(56) References Cited

U.S. PATENT DOCUMENTS

| | | | |
|---|---|---|---|
| 9,835,931 | B1 | 12/2017 | Pelteku |
| 9,841,658 | B1 * | 12/2017 | Ng .............................. G02F 7/00 |
| 9,843,398 | B1 | 12/2017 | Zanoni et al. |
| 10,534,446 | B2 | 1/2020 | Hiromi et al. |
| 10,795,005 | B2 | 10/2020 | Hiromi |
| 2010/0201345 | A1 * | 8/2010 | Gupta ........................ G02F 7/00 |
| | | | 341/137 |
| 2013/0062508 | A1 * | 3/2013 | Kanter ................ H03M 1/1265 |
| | | | 250/214 DC |
| 2013/0315597 | A1 * | 11/2013 | Shaver ................ H04J 14/0227 |
| | | | 398/79 |
| 2019/0302571 | A1 * | 10/2019 | Betts ................... H03M 1/1245 |

FOREIGN PATENT DOCUMENTS

| | | |
|---|---|---|
| JP | 1988062728 B2 | 12/1988 |
| JP | 2001186348 A | 7/2001 |
| TW | I570384 B | 2/2017 |

* cited by examiner

NON-UNIFORM SAMPLING PHOTONIC ANALOG-TO-DIGITAL CONVERTER

GOVERNMENT SUPPORT

This technology was developed with U.S. government support under Government Contract No. NR0000-14-C-0206 and Government Contract No. NR0000-21-C-0104 awarded by the National Reconnaissance Office. The U.S. government has certain rights in this invention.

BACKGROUND

There is a need to monitor and digitize large swaths of bandwidth with high resolution. This generates large amounts of data that is difficult to transport, process, and analyze.

SUMMARY

A non-uniform sampling photonic analog-to-digital converter (pADC) is disclosed, in accordance with one or more embodiments of the disclosure. In one embodiment, the non-uniform sampling pADC includes an optical pulse source, the optical pulse source configured to generate one or more uniform optic pulses. In another embodiment, the non-uniform sampling pADC includes a non-uniform sampling system. In another embodiment, the non-uniform sampling system includes an inter-pulse timing modulation sub-system, the inter-pulse timing modulation sub-system configured to convert the one or more uniform optic pulses into one or more non-uniform optic pulses. In another embodiment, the non-uniform sampling system includes a timing control sub-system, the timing control sub-system configured to control the timing of the optical pulse source. In another embodiment, the non-uniform sampling pADC includes an optical modulator, the optical modulator configured to modulate the one or more non-uniform optical pulses from the inter-pulse timing modulation sub-system. In another embodiment, the non-uniform sampling pADC includes a photodetector, the photodetector configured to convert the one or more modulated non-uniform optic pulses into one or more electronic pulses. In another embodiment, the non-uniform sampling pADC includes a pulse capture assembly, the pulse capture assembly configured to capture a pulse amplitude of the one or more electronic pulses and generate one or more sampled radio frequency output pulses. In another embodiment, the non-uniform sampling pADC includes a quantizer, the quantizer configured to quantize the one or more sampled radio frequency output pulses and generate one or more digital radio frequency output signals.

In some embodiments, the non-uniform sampling system may include a serial switched delay line sub-system.

In some embodiments, the inter-pulse timing modulation sub-system may include one or more fast optical switches, the one or more fast optical switches in series; and a set of optical paths between the one or more fast optical switches, each set of optical paths including one or more first delay lines and one or more additional delay lines, the set of delay lines in series.

In some embodiments, a delay line length of the one or more first delay lines may be 0, a delay line length of the one or more additional delay lines may be between $\Delta T$ and $(2^N-1)\Delta T$.

In some embodiments, the timing control sub-system may include a pattern generator, the pattern generator configured to generate a digital control code and provide the digital control code to the one or more optical switches, the digital control code configured to control the one or more optical switches.

In some embodiments, the non-uniform sampling system may include a parallel switched delay line sub-system.

In some embodiments, the inter-pulse timing modulation sub-system may include an optical switch, the optical switch configured to receive the one or more uniform optic pulses from the optical pulse source; one or more optical paths, the one or more optical paths in parallel, the one or more optical paths including one or more delay lines configured to generate one or more delay line signals, the one or more delay lines having one or more delay line lengths; and a combiner, the combiner configured to combine the one or more delay line signals from the one or more optical paths to generate the one or more non-uniform optic pulses.

In some embodiments, the one or more delay line lengths may be between 0 and $(2^N-1)\Delta T$.

In some embodiments, the timing control sub-system may include a pseudo-random generator, the pseudo-random generator configured to generate a digital control code and provide the digital control code to the optical switch, the digital control code configured to control the optical switch.

In some embodiments, the pulse capture assembly may include an integrate-and-dump circuit configured to capture the pulse amplitude of the electronic signal.

In some embodiments, the converter may further include a timing recovery sub-system configured to determine a non-uniform timing signal.

In some embodiments, the timing recovery sub-system may include an optical non-uniform clock recovery circuit, the optical non-uniform clock recovery circuit may include an optical splitter, the optical splitter configured to receive the one or more uniform optic pulses from the optical pulse source, the optical splitter coupled to one or more channels; and a coherent detection module, the coherent detection module configured to determine a maximum peak output for the one or more channels.

A non-uniform sampling photonic analog-to-digital converter (pADC) is disclosed, in accordance with one or more embodiments of the disclosure. In one embodiment, the non-uniform sampling pADC includes an optical pulse source, the optical pulse source configured to generate one or more uniform optic pulses. In another embodiment, the non-uniform sampling pADC includes a serial switched delay line system. In another embodiment, the serial switched delay line system includes an inter-pulse timing modulation sub-system, the inter-pulse timing modulation sub-system configured to convert the one or more uniform optic pulses into one or more non-uniform optic pulses. In another embodiment, the non-uniform sampling system includes a timing control sub-system, the timing control sub-system configured to control the timing of the optical pulse source, the timing control sub-system including a pattern generator, the pattern generator configured to generate a digital control code and provide the digital control code to the one or more fast optical switches, the digital control code configured to control the one or more optical switches. In another embodiment, the non-uniform sampling pADC includes an optical modulator, the optical modulator configured to modulate the one or more non-uniform optical pulses from inter-pulse timing modulation sub-system. In another embodiment, the non-uniform sampling pADC includes a photodetector, the photodetector configured to convert the one or more modulated non-uniform optic pulses into one or more electronic pulses. In another embodiment, the non-uniform sampling pADC includes a pulse capture assembly, the pulse capture assembly configured to capture a pulse amplitude of the one or more electronic pulses and generate one or more sampled radio frequency output pulses. In another embodiment, the non-uniform sampling pADC includes a quantizer, the quantizer configured to quantize the one or more sampled radio frequency output pulses and generate one or more digital radio frequency output signals.

In some embodiments, the converter may further include a timing recovery sub-system configured to determine a non-uniform timing signal.

In some embodiments, the timing recovery sub-system may include optical non-uniform clock recovery circuit, the optical non-uniform clock recovery circuit may include an optical splitter, the optical splitter configured to receive the one or more uniform optic pulses from the optical pulse source, the optical splitter coupled to one or more channels; and a coherent detection module, the coherent detection module configured to determine a maximum peak output for the one or more channels.

This Summary is provided solely as an introduction to subject matter that is fully described in the Detailed Description and Drawings. The Summary should not be considered to describe essential features nor be used to determine the scope of the Claims. Moreover, it is to be understood that both the foregoing Summary and the following Detailed Description are examples and explanatory only and are not necessarily restrictive of the subject matter claimed.

BRIEF DESCRIPTION OF THE DRAWINGS

The detailed description is described with reference to the accompanying figures. The use of the same reference numbers in different instances in the description and the figures may indicate similar or identical items. Various embodiments or examples ("examples") of the disclosure are disclosed in the following detailed description and the accompanying drawings. The drawings are not necessarily to scale. In general, operations of disclosed processes may be performed in an arbitrary order, unless otherwise provided in the claims. In the drawings:

DETAILED DESCRIPTION OF THE INVENTION

Figure 1:
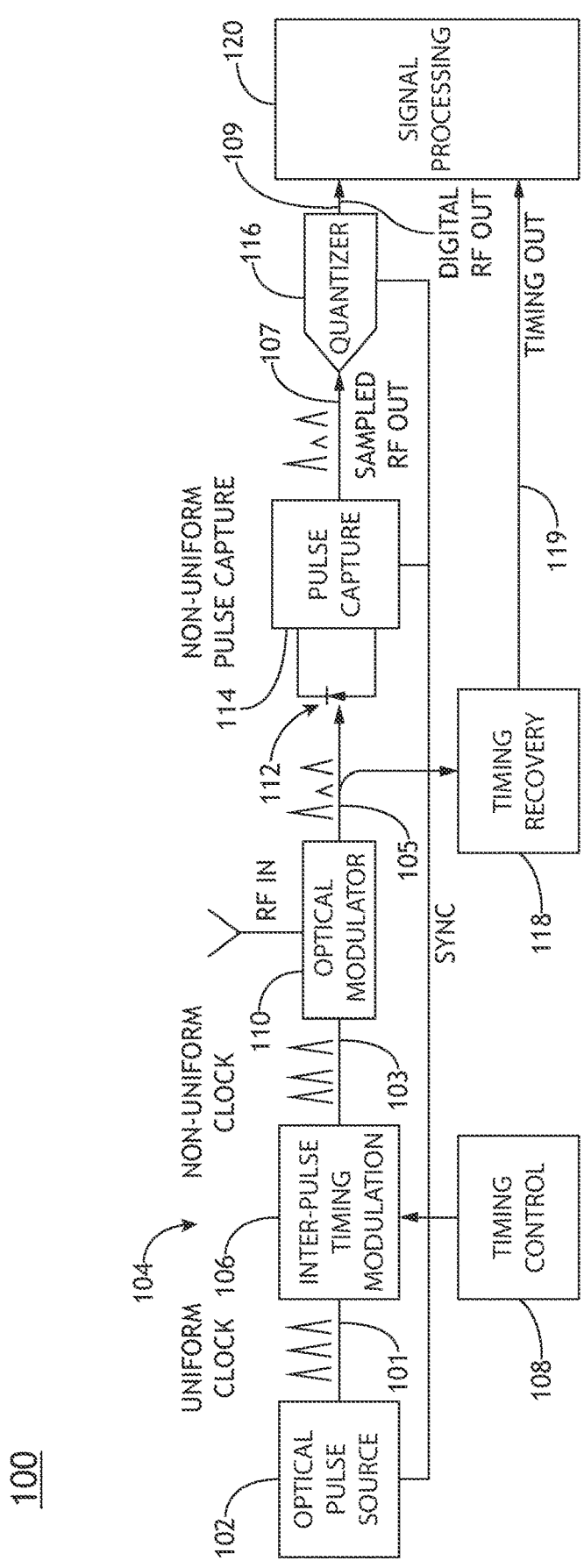
FIG. 1 illustrates a simplified schematic of the non-uniform sampling pADC, in accordance with one or more embodiments of the disclosure.

Reference will now be made in detail to the subject matter disclosed, which is illustrated in the accompanying drawings.

Before explaining one or more embodiments of the disclosure in detail, it is to be understood the embodiments are not limited in their application to the details of construction and the arrangement of the components or steps or methodologies set forth in the following description or illustrated in the drawings. In the following detailed description of embodiments, numerous specific details may be set forth in order to provide a more thorough understanding of the disclosure. However, it will be apparent to one of ordinary skill in the art having the benefit of the instant disclosure the embodiments disclosed herein may be practiced without some of these specific details. In other instances, well-known features may not be described in detail to avoid unnecessarily complicating the instant disclosure.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination of or sub-combination of two or more such features, along with any other features which may not necessarily be expressly described or inherently present in the instant disclosure.

FIGS. 1-7 generally illustrate a non-uniform sampling photonic analog-to-digital converter system, in accordance with one or more embodiments of the disclosure.

There is a need to monitor and digitize large swaths of the radio frequency spectrum with high resolution. This activity generates a large amount of data that is difficult to transport, process, and analyze. In some cases, much of the spectrum does not contain meaningful information. The Nyquist Zone Folding Receiver (NZFR) is an architecture that allows for a digital sampling receiver to collapse a large frequency range comprised of multiple Nyquist zones to a narrow frequency range spanning a single Nyquist zone. While the NZFR reduces the amount of data produced by a receiver operating over N Nyquist zones by a factor of N, knowledge of which zone the signal originated in is lost due to aliasing.

In order to recover the Nyquist zone information, non-uniform sampling may be used to generate non-uniform pulses from uniform pulses. Photonics assisted ADCs use low jitter pulsed lasers to perform sampling in the optical domain. High speed optical techniques can be used to generate sampling pulses with non-uniform timing. For example, pulse decimation may be used to generate non-uniform pulses. However, pulse decimation limits the pulse rate and reduces the average optical power by the decimation ratio. Additionally, pulse decimation can introduce noise if pulses leak through the optical switch due to insufficient switching extinction ratio. By way of another example, acousto-optic modulation may be used to generate non-uniform pulses. However, acousto-optic modulation requires free space components and limits the modulation range. By way of another example, the uniform clock may be divided into a number of lower repetition rate uniform clocks, then delayed by a fixed amount time before being recombined. However, this method does not provide pseudo-random sampling capability, rather it is a simplified static non-uniform sampling setup. Further, it does solve the ambiguity issue when there are multiple frequency components that share the same baseband frequency.

NZFRs have low sampling rates and resolution is poor due to a number of reasons. For example, the bandwidth required to rapidly change the sampling timing causes low sampling rates and poor resolution. By way of another example, the difficulty in synchronizing a rapidly changing timing pulse with a high resolution digitizer. By way of another example, the input bandwidth of the digitizer. Additionally, NZFRs only report the spectrum information, rather than digitizing the full amplitude and phase information.

As such, there is a need for a non-uniform sampling photonic analog-to-digital converter (pADC) system that cures one or more shortfalls of the previous approaches. The system should be configured to recover the amplitude and where the band comes from. The system should preserve the low jitter of a Mode-Locked Laser (MLL) or other low jitter photonic clock to achieve a high Effective Number of Bits (ENOB). The system should have a lower sampling rate than a Nyquist sampling ADC.

FIGS. 1-7 generally illustrate a non-uniform sampling pADC, in accordance with one or more embodiments of the disclosure.

The pADC 100 may include an optical pulse source 102 configured to generate one or more optic pulses with uniform pulse-to-pulse timing 101. For example, the optical pulse source 102 may include a uniform clock 102. For instance, the optical pulse source 102 may include a pulsed laser 102.

The optical pulse source 102 may be further configured to generate one or more synchronization (sync) signals configured to synchronize the timing between the one or more components of the pADC 100. For example, the timing modulation switches may need to be switched between pulses and the synchronization signals may be configured to switch the timing modulation switches. By way of another example, the InD circuit 400 may need to be aligned in time so that the pulses arrive within the integration window. By way of another example, the quantizer 116 needs to be aligned with the output of the InD circuit 400.

The pADC 100 may include a non-uniform sampling system 104 including an inter-pulse timing modulation sub-system 106 and a timing control sub-system 108. The system 104 may be configured to convert one or more uniform optic pulses 101 into one or more non-uniform optic pulses 103. It is noted that non-uniform sampling timing allows for Nyquist zone recovery.

Figure 2:
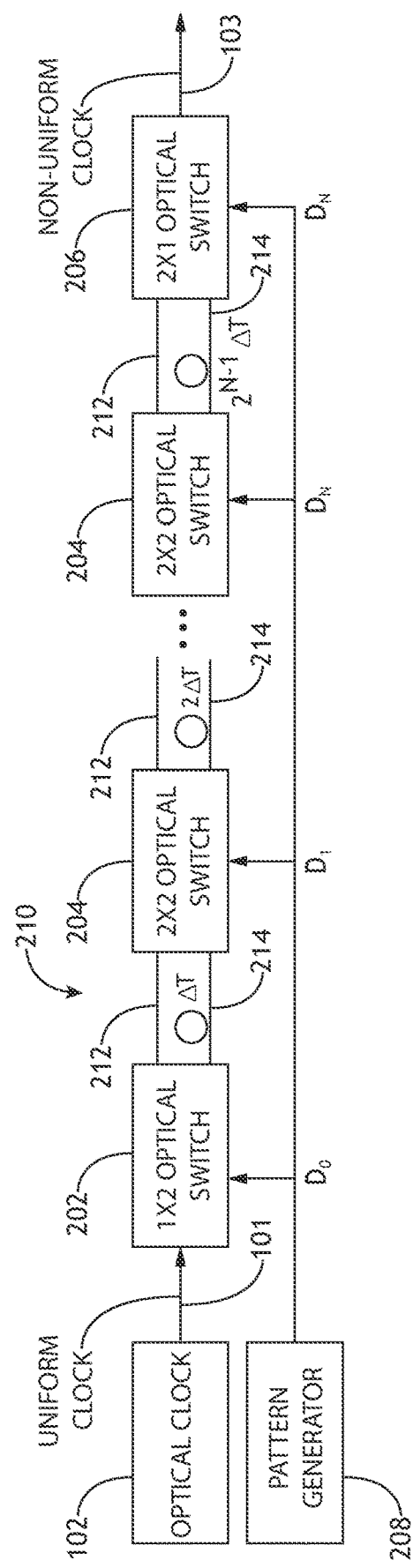
FIG. 2 illustrates a simplified schematic of a serial switch delay line sub-system of the pADC, in accordance with one or more embodiments of the disclosure.

Referring to FIG. 2, the system 104 may be a serial switched delay line sub-system 200, including the inter-pulse timing modulation sub-system 106 and the timing control sub-system 108. For example, the inter-pulse timing modulation sub-system 106 may include one or more switches 202-206 and the timing control sub-system 108 may include a pattern generator 208.

The one or more switches may include an input optical switch 202 configured to receive the one or more uniform optic pulses 101 from the optical pulse source 102 (e.g., optical clock). For example, the input optical switch 202 may include a 1×2 optical switch, where the 1×2 optical switch includes a single input coupled to the source 102 and two outputs coupled to one or more additional components of the sub-system 200 (e.g., additional switches).

The one or more switches may further include one or more intermediate optical switches 204. For example, the one or more intermediate switches 204 may include one or more 2×2 optical switches, where each 2×2 optical switch includes two inputs and two outputs. It is noted that the sub-system 200 may include any number of intermediate switches 204. For example, the sub-system 200 may include a first intermediate switch 204, a second intermediate switch 204, up to an N number of intermediate switches.

The one or more switches may further include an output optical switch 206 configured to provide the one or more non-uniform optic pulses 103 to an optical modulator 110.

It is noted that the one or more optical switches 202-206 may include any type of fast optical switch (e.g., a switch with a switch speed faster than the pulse repetition frequency) including, but not limited to, a lithium niobate optical switch, an integrated silicon photonic switch, an indium phosphide switch, or the like.

The pattern generator 208 may be configured to control the one or more optical switches and may be configured to generate a digital control code to control which path the signal takes for the next stage of delay lines 212-214. For example, the pattern generator 208 may be configured to control the input optical switch 202. For instance, the pattern generator 208 may be configured to generate a control signal $D_0$ and provide the control signal $D_0$ to the 1×2 input optical switch 202 to control where the signal will go after reaching the 1×2 input optical switch 202. By way of another example, the pattern generator 208 may be configured to control the one or more intermediate optical switches 204. In one instance, the pattern generator 208 may be configured to generate a control signal $D_1$ and provide the control signal $D_1$ to the 2×2 intermediate optical switch 204 to control where the signal will go after reaching the 2×2 intermediate optical switch 204. In another instance, the pattern generator 208 may be configured to generate a control signal $D_N$ and provide the control signal $D_N$ to the 2×2 intermediate optical switch 204 to control where the signal will go after reaching the 2×2 intermediate optical switch 204. By way of another example, the pattern generator 208 may be configured to control the output optical switch 206 to control where the signal will go after reaching the 2×1 output optical switch 206. For instance, the pattern generator 208 may be configured to generate a control signal $D_N$ and provide the control signal $D_N$ to the 2×1 output optical switch 206 to cause the optical switch 206 to provide the signal 103 to the optical modulator 110.

The sub-system 200 may include a set of optical paths 210 between the one or more switches. For example, the set of optical paths 210 may include one or more delay lines, with delay line lengths 212 between $0-(2^N-1)\Delta T$. For instance, the one or more delay lines may include a first delay line length 212 with a delay line length of 0 and an additional delay line length 214 with a delay line length greater than zero (e.g., between $\Delta T-(2^N-1)\Delta T$) but less than the uniform pulse-to-pulse period. For example, between the input switch 202 and the first intermediate switch 204, the additional delay line 214 may have a delay line length of $\Delta T$. By way of another example, between the first intermediate switch 204 and the additional intermediate switch 204, the additional delay line 214 may have a delay line length of $2\Delta T$. By way of another example, between the intermediate switch 204 and the output switch 206, the additional delay line 214 may have a delay line length of $2^{N-1}\Delta T$.

Each pulse may go through a different combination of delay lines 212-214 depending on the received control signal $(D_0-D_N)$ from the pattern generator 208. The additional delay line 214 may be configured to create a time difference between the input and output signal to generate a non-uniform signal. Each optical pulse source 102 may be delayed by:

$$dt = \sum_{n=0}^{N-1} D_n(2^n - 1) \cdot \Delta T \qquad \text{Equation 1}$$

where $dt$ covers ranges from 0 to $(2^n - 1) \cdot \Delta T$,

In Equation 1, dt is the delay time of the non-uniform clock pulse from the uniform clock pulse, n is the switch stage number, $\Delta T$ is the time delay step of the delay lines, and $N=T/\Delta T$ is the total number of stages of the delay line.

Figure 3:
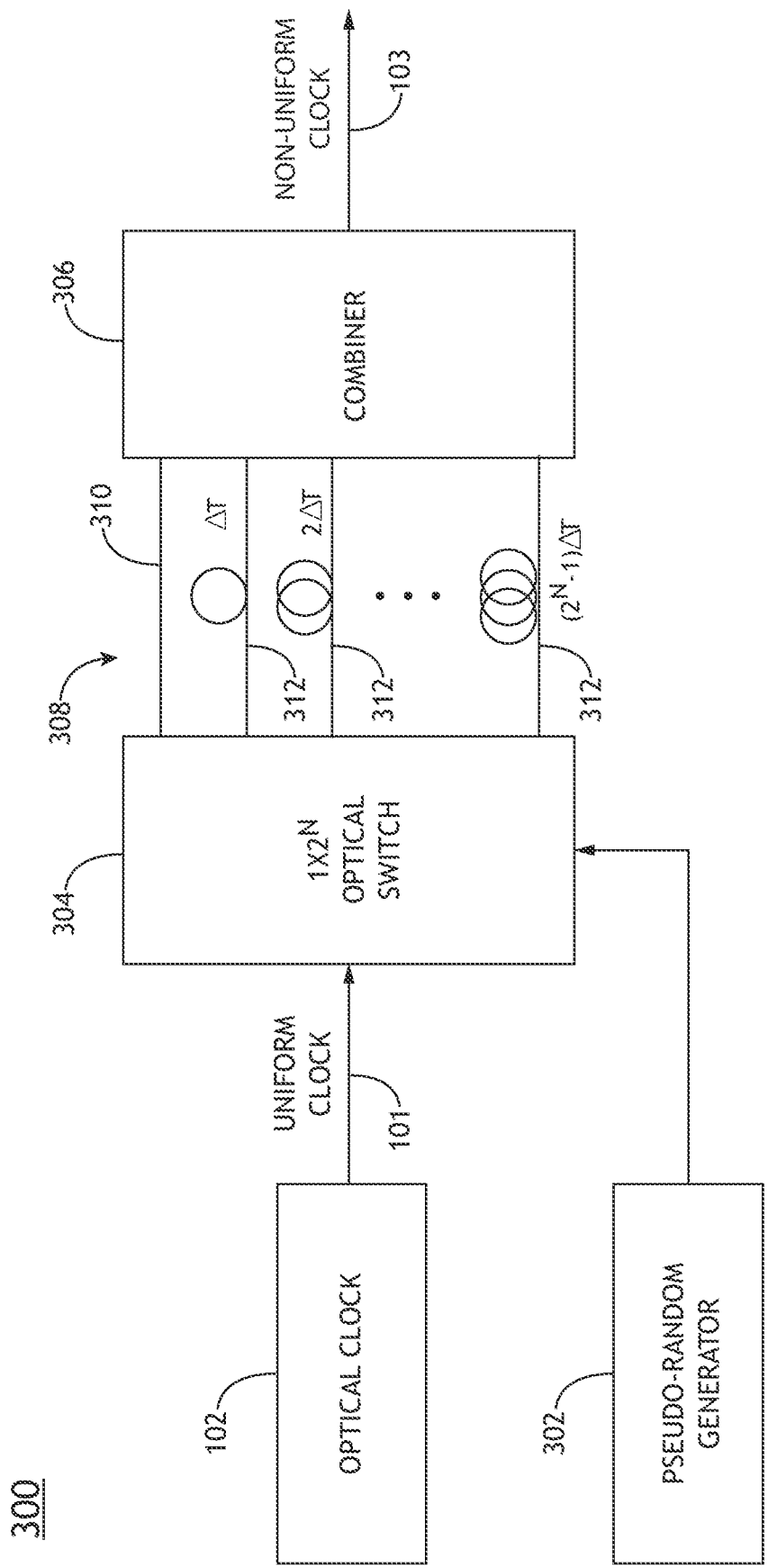
FIG. 3 illustrates a simplified schematic of a parallel switch delay line sub-system of the pADC, in accordance with one or more embodiments of the disclosure.

Referring to FIG. 3, the assembly 104 may include a parallel switch delay line sub-system 300. The sub-system 300 may include a pseudo-random generator 302 configured to control the optical switch 304.

The sub-system 300 may include an optical switch 304 configured to receive the one or more uniform optic pulses 101 from the optical pulse source 102 (e.g., optical clock). For example, the optical switch 304 may include a $1 \times 2^N$ optical switch, where the optical switch includes one input and $2^N$ outputs, where N is an integer.

It is noted that the optical switch 304 may include any type of fast optical switch (e.g., a switch with a switch speed faster than the pulse repetition frequency) including, but not limited to, a lithium niobate optical switch, an integrated silicon photonic switch, an indium phosphide switch, or the like.

The sub-system 300 may include a combiner 306 configured to combine one or more signals from the optical switch 304 and generate one or more non-uniform clock pulses 103.

There may be one or more optical paths 308 between the optical switch 304 and the combiner 306. For example, the one or more optical paths 308 may include one or more delay lines, with delay line lengths between $0-(2^N-1)\Delta T$. For instance, the one or more delay lines may include a first delay line length 310 with a delay line length of 0 and one or more additional delay line lengths 312 with a delay length greater than zero (e.g., between $0-(2^N-1)\Delta T$). For example, the first delay line 312 may have a length of $\Delta T$. By way of another example, the second delay line 312 may have a length of $2\Delta T$. By way of another example, the third delay line 312 may have a delay line length of $(2^N-1)\Delta T$.

The one or more additional delay lines 312 may be configured to create a time difference between the input and output signal to generate a non-uniform signal. Each optical pulse source 102 may be delayed by Equation 1 (shown and described above).

Referring again to FIG. 1, the pADC 100 may include an optical modulator configured to modulate the optical pulses 103 from inter-pulse timing modulation sub-system 106. For example, the optical modulator 110 may be configured to modulate the non-uniform optical pulses 103 from the output optical switch 206 (e.g., 2×1 optical switch). By way of another example, the optical modulator 110 may be configured to modulate the non-uniform optical pulses 103 from the combiner 306.

Referring again to FIG. 1, the pADC 100 may include a photodetector 112 configured to convert the optical signal into an electronic signal. For example, the photodetector 112 may include a photodiode 112 configured to convert the optical signal 105 into an electronic signal.

The pADC 100 may include a pulse capture assembly 114 configured to capture the pulse amplitude of the electronic signal and generate one or more sampled RF output signals 107.

It is noted that a conventional ADC will not be adequate to capture the pulse amplitude because conventional ADCs require precise synchronization of the input pulsed signal and a uniform reference clock. Further, it is noted that conventional "track and hold" circuits are not sufficient because they do not have enough bandwidth to react to rapidly changing reference clock timing resulting in analog-to-digital conversion error. As such, referring to FIG. 4A, the pulse capture assembly 114 may include an integrate-and-dump (InD) circuit 400. The InD circuit 400 may have a relaxed timing tolerance and does not require precise synchronization of a pulse to be captured and a reference clock.

Figure 4A:
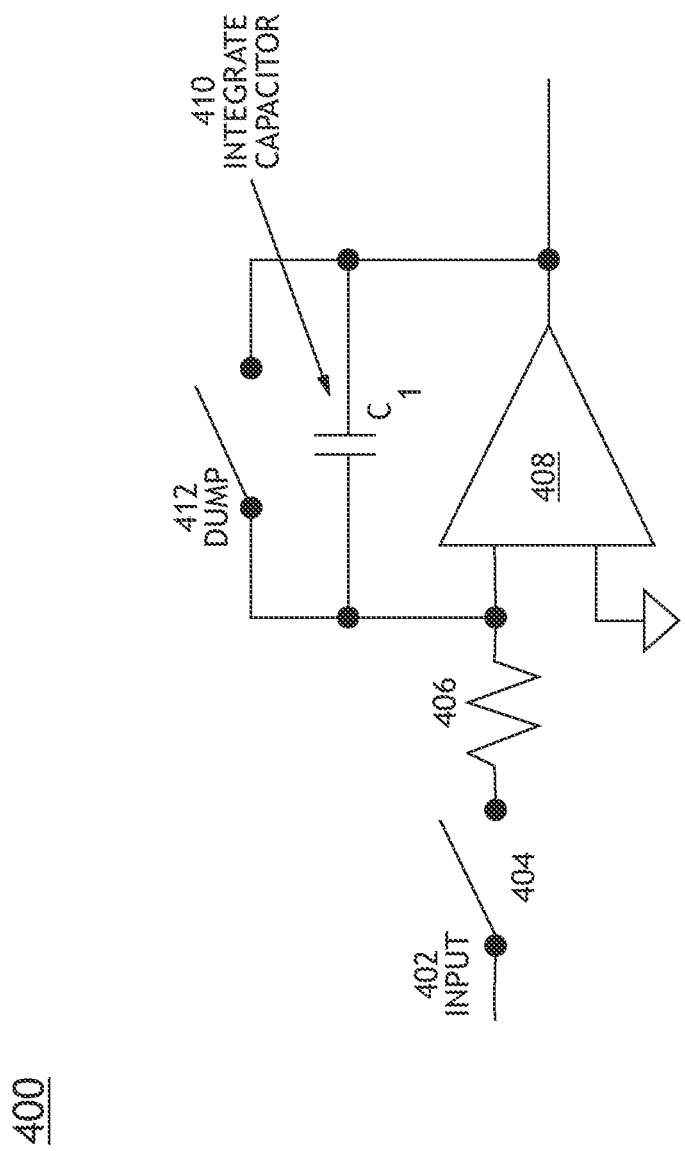
FIG. 4A illustrates a simplified schematic of an integrate-and-dump circuit, in accordance with one or more embodiments of the disclosure.
Figure 4B:
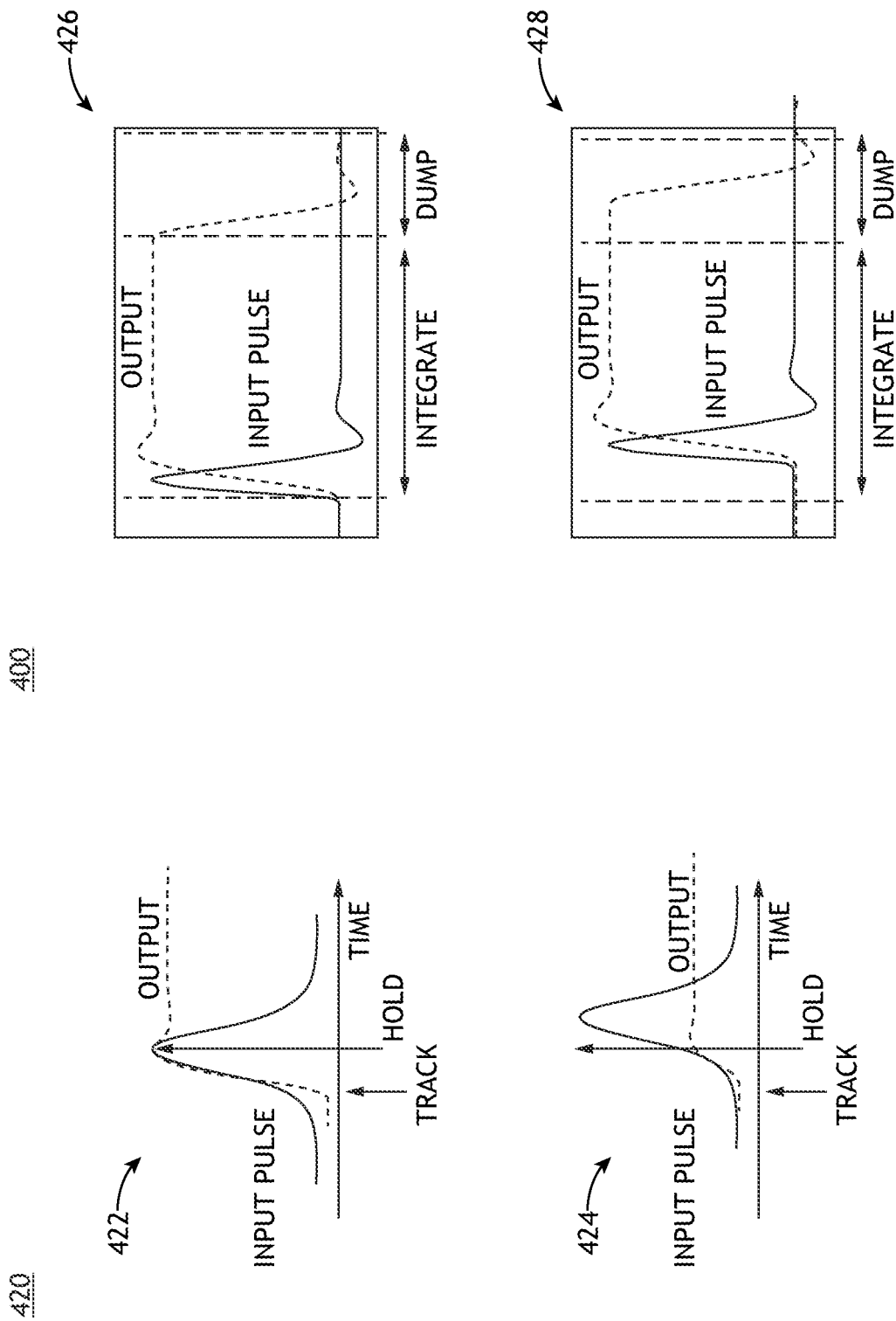
FIG. 4B illustrates a comparison of a track and hold circuit and an integrate-and-dump circuit, in accordance with one or more embodiments of the disclosure.
Figure 4C:
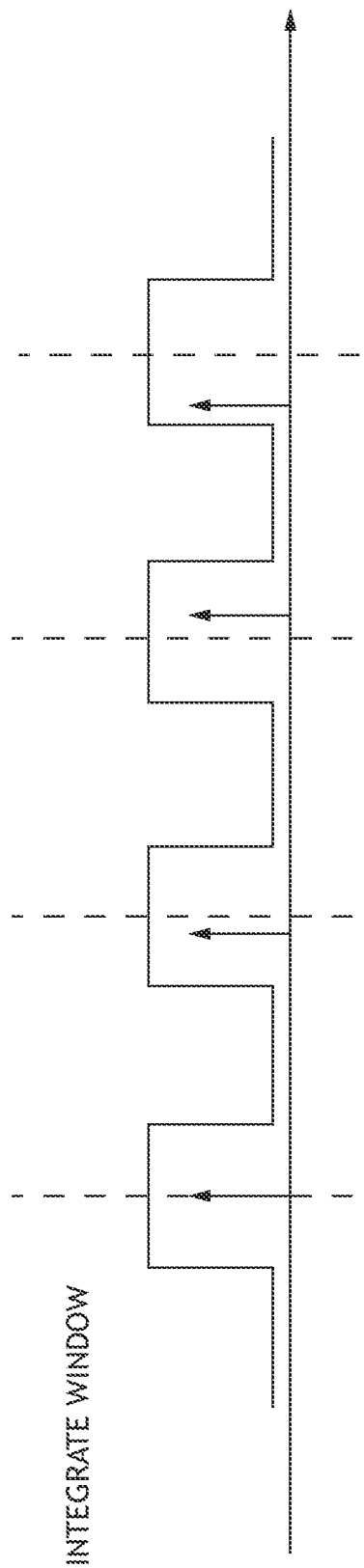
FIG. 4C illustrates a plot for an integrate-and-dump circuit, in accordance with one or more embodiments of the disclosure.

Referring to FIG. 4A, the InD circuit 400 may include, but is not limited to, an input current source 402 (e.g., photodiode), a switch 404, an operational amplifier 408, an integrating capacitor 410, and a dump switch 412. The InD circuit 400 may be configured to capture the pulse amplitude. Referring to FIG. 4C, the InD circuit 400 may have an integration window 430. Integrate-and-dump circuits are generally discussed in U.S. Pat. No. 9,835,931, entitled Differential voltage-mode integrate and dump photonic analog to digital converter (pADC), issued on Dec. 5, 2017, which is incorporated by reference in the entirety.

It is noted that the conventional method for capturing pulsed signals uses track and hold circuits to capture signal voltages. For pulsed signals, this requires precise timing to capture the peak of the pulse. However, electronic circuits do not have the bandwidth to react to rapidly changing clock timing. As such, it would be advantageous to use a InD circuit, such as the InD circuit 400 shown in FIG. 4A, to capture pulsed signals. FIG. 4B depicts a comparison of a track and hold circuit 420 and the InD circuit 400. For example, in plots 422, 426 the pulse and capture clocks are synchronized. By way of another example, when comparing the plot 424 and the plot 428, the timing change degrades the output in the track and hold circuit 420 (shown in plot 424), however, the timing change does not affect the output in the InD circuit 400 (shown in plot 428).

Referring again to FIG. 1, the pADC 100 may include a quantizer 116 configured to quantize the sampled RF output signal 107 to generate a digital RF output 109. The digital RF output 109 may be transferred to further electronics for processing.

Figure 5:
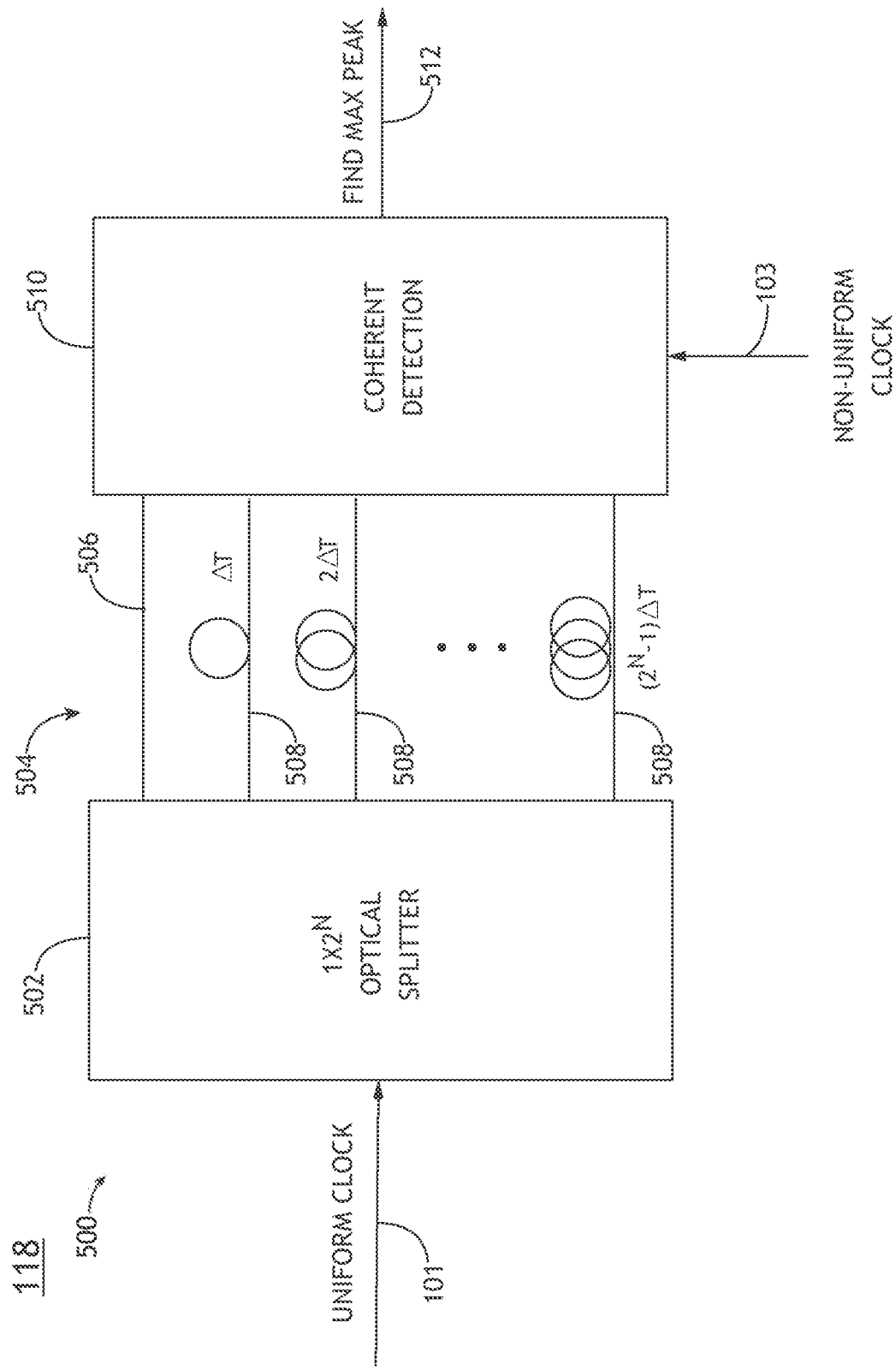
FIG. 5 illustrates a simplified schematic of an optical non-uniform clock recovery circuit, in accordance with one or more embodiments of the disclosure.
Figure 6:
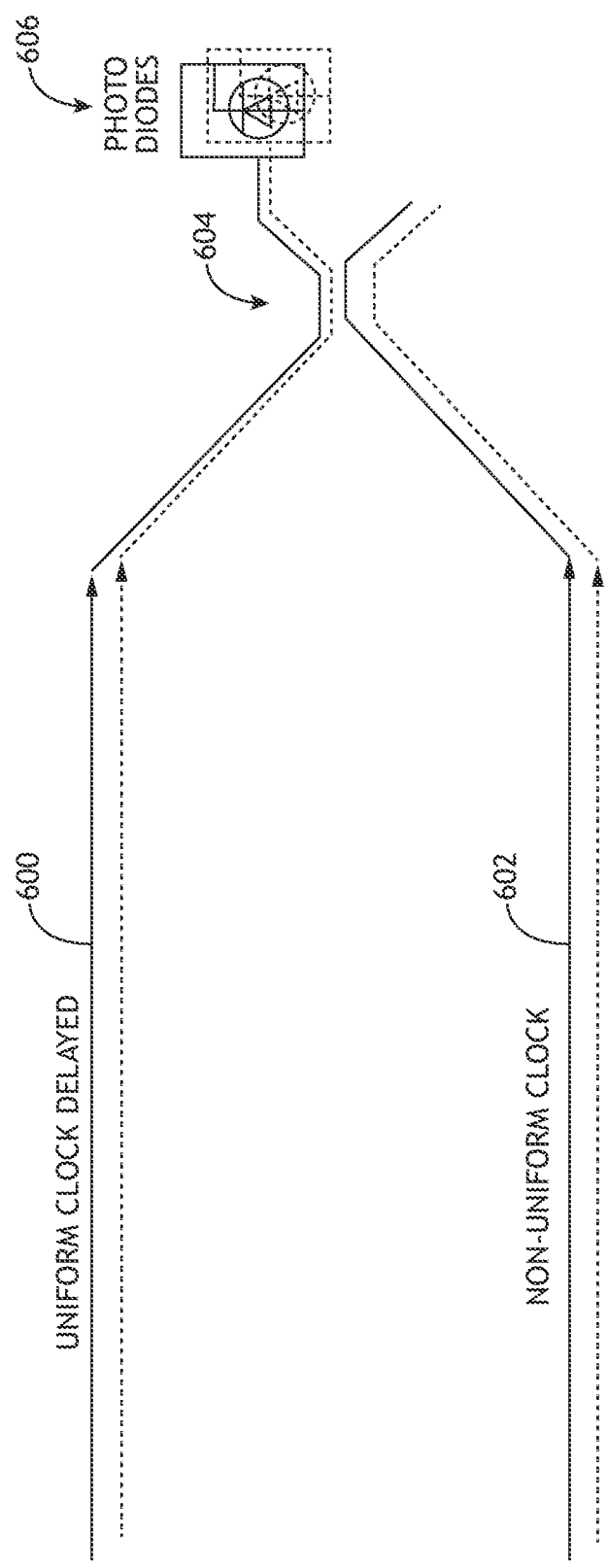
FIG. 6 illustrates a simplified schematic of a coherent detection module of the optical non-uniform clock recovery sub-system, in accordance with one or more embodiments of the disclosure.

Referring to FIG. 5, it is noted that in order to recover the analog signal from the non-uniformly sampled data, the timing modulation/offset from the uniform master clock must be known. Referring again to FIG. 1, the timing control assembly 108 may be configured to determine a timing offset of the optical pulse source 102. For example, when the timing modulation is not known, the non-uniform signal timing must be determined. The pADC 100 may include a timing recovery sub-system 118. For example, the timing recovery sub-system 118 may include optical non-uniform clock recovery circuit 500 configured to determine the non-uniform signal timing.

The circuit 500 may include an optical splitter 502 configured to receive the uniform clock signal 101. For example, the optical splitter 502 may include a $1 \times 2^N$ optical splitter. In this example, the optical splitter 502 may include one input (from the source 102) and $2^N$ outputs, where N is an integer. In this regard, the optical source 102 may be split into $2^N$ channels with delay line lengths 508 between $0-(2^N-1)\Delta T$.

The circuit 500 may include one or more coherent detection modules 510. Each coherent detection module 510 may include a first arm 600 and a second arm 602, where the first arm 600 may be an input from the delayed uniform clock and the second arm 602 may be an input from the non-uniform clock. Further, each coherent detection module 510 may include a combiner 604.

The circuit 500 may be configured to compare the delayed signal from the first arm 600 with the non-uniform clock of the second arm 602. When the delay applied to the uniform clock matches the non-uniform clock they will both arrive at the combiner 604 at the same time.

The circuit 500 may include one or more photodetectors 606 configured to convert the optical output of the combiner 604 into an electronic signal. For example, the circuit 500 may include one or more photodiodes 606 configured to convert the output of the combiner 604 into an electronic signal. When signals from the delayed uniform clock and non-uniform clock arrive at the photodiode 606 simultaneously, they are mixed to form a large electrical signal. By determining which photodiode has a large signal for any given clock pulse, the non-uniform clock timing position may be determined and the circuit 500 may be configured to generate a timing out signal 118 and provide the signal to a signal processing sub-system 120 configured to perform one or more signal processing techniques to the signal.

Figure 7:
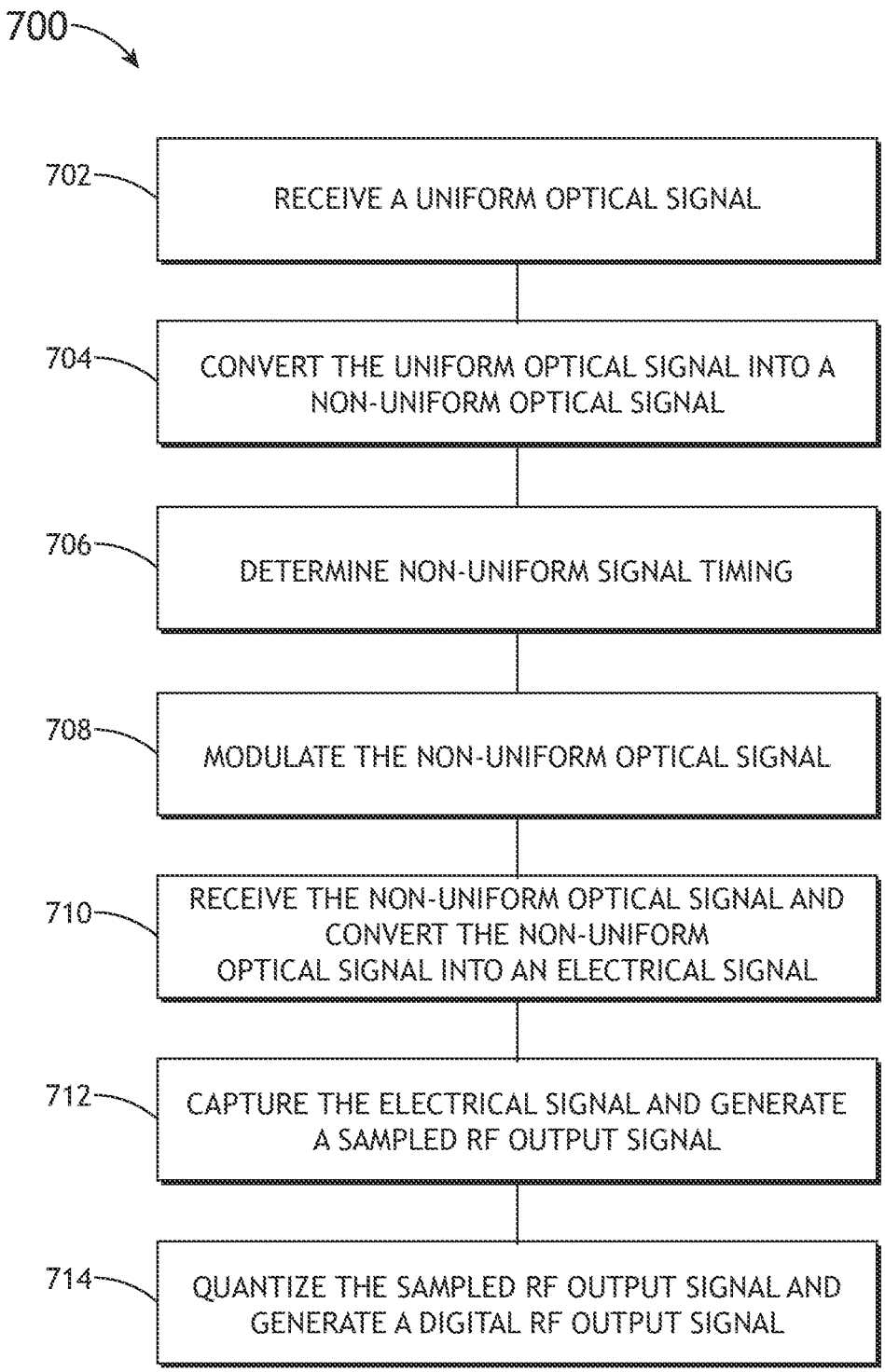
FIG. 7 illustrates a flowchart depicting a method or process for the pADC, in accordance with one or more embodiments of the disclosure.

FIG. 7 illustrates a flowchart depicting a method or process for the non-uniform sampling pADC, in accordance with one or more embodiments of the disclosure.

In a step 702, a uniform optical signal is received from an optical pulse source. For example, the optical pulse source 102 may be configured to generate one or more uniform optic pulses 101. For instance, the optical pulse source 102 may include a uniform clock 102 (e.g., pulsed laser) configured to generate one or more uniform clock signals.

In a step 704, the uniform optical signals may be converted into non-uniform optical signals. For example, the switched delay line sub-system 200 may be configured to generate one or more non-uniform optical signals 103 using one or more optical switches 202-206 and a pattern generator 208. By way of another example, the parallel delay line sub-system 200 may be configured to generate one or more non-uniform optical signals 103 using an optical switch 304 and a pseudo-random generator 208.

In an optional step 706, when the timing modulation is not known, the non-uniform signal timing may be determined. For example, the non-uniform signal timing may be determined using the clock timing recovery circuit 500. For instance, when signals from the delayed uniform clock and non-uniform clock arrive at the photodiode simultaneously, they may be mixed to form large electrical signal. By determining which photodiode has a large signal for any given clock pulse, the non-uniform clock timing position may be determined.

In a step 708, the optical pulses may be modulated. For example, an optical modulator configured to modulate the optical pulses 103 from inter-pulse timing modulation sub-system 106. For example, the optical modulator 110 may be configured to modulate the non-uniform optical pulses 103 from the output optical switch 206 (e.g., 2×1 optical switch). By way of another example, the optical modulator 110 may be configured to modulate the non-uniform optical pulses 103 from the combiner 306.

In a step 710, the optical signal may be converted into an electronic signal. For example, the photodetector 112 may be configured to convert the optical signal into an electronic signal. For instance, the photodetector 112 may include a photodiode 112 configured to convert the optical signal 105 into an electronic signal.

In a step 712, the non-uniform optical signals may be captured using a pulse capture assembly 114. For example, the pulse capture assembly 114 may be configured to capture the signals and generate one or more sampled RF output signals 107. For instance, the pulse capture assembly 114 may include an integrate-and-dump (InD) circuit 400 including, but not required to include, an input source 402 (e.g., photodiode), a switch 404, a resistor 406, an operational amplifier 408, an integrating capacitor 410, and a dump switch 412.

In a step 714, the sampled RF output signals 107 may be quantized and a digital RF output 109 may be generated. For example, the quantizer 116 may be configured to quantize the sampled RF output signal 107 to generate a digital RF output 109. The digital RF output 109 may be transferred to further electronics for processing which may include the use of the recovered clock timing.

It is to be understood that embodiments of the methods disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

Although inventive concepts have been described with reference to the embodiments illustrated in the attached drawing figures, equivalents may be employed and substitutions made herein without departing from the scope of the claims. Components illustrated and described herein are merely examples of a system/device and components that may be used to implement embodiments of the inventive concepts and may be replaced with other devices and components without departing from the scope of the claims. Furthermore, any dimensions, degrees, and/or numerical ranges provided herein are to be understood as non-limiting examples unless otherwise specified in the claims.

What is claimed:

1. A non-uniform sampling photonic analog-to-digital converter comprising an optical pulse source, the optical pulse source configured to generate one or more uniform optic pulses;

a non-uniform sampling system, the non-uniform sampling system comprising:
- an inter-pulse timing modulation sub-system, the inter-pulse timing modulation sub-system configured to convert the one or more uniform optic pulses into one or more non-uniform optic pulses; and
- a timing control sub-system, the timing control sub-system configured to control the timing of the optical pulse source;

an optical modulator, the optical modulator configured to modulate the one or more non-uniform optical pulses from the inter-pulse timing modulation sub-system;

a photodetector, the photodetector configured to convert the one or more modulated non-uniform optic pulses into one or more electronic pulses;

a pulse capture assembly, the pulse capture assembly configured to capture a pulse amplitude of the one or more electronic pulses and generate one or more sampled radio frequency output pulses; and a quantizer, the quantizer configured to quantize the one or more sampled radio frequency output pulses and generate one or more digital radio frequency output signals.

2. The converter of claim 1, wherein the non-uniform sampling system includes a serial switched delay line sub-system.

3. The converter of claim 2, wherein the inter-pulse timing modulation sub-system comprises:
- one or more fast optical switches, the one or more fast optical switches in series; and
- a set of optical paths between the one or more fast optical switches, each set of optical paths including one or more first delay lines and one or more additional delay lines, the set of delay lines in series.

4. The converter of claim 3, wherein a delay line length of the one or more first delay lines is 0, a delay line length of the one or more additional delay lines between $\Delta T$ and $(2^N-1)\Delta T$.

5. The converter of claim 3, wherein the timing control sub-system comprises:
- a pattern generator, the pattern generator configured to generate a digital control code and provide the digital control code to the one or more optical switches, the digital control code configured to control the one or more optical switches.

6. The converter of claim 1, wherein the non-uniform sampling system includes a parallel switched delay line sub-system.

7. The converter of claim 6, wherein the inter-pulse timing modulation sub-system comprises:
- an optical switch, the optical switch configured to receive the one or more uniform optic pulses from the optical pulse source;
- one or more optical paths, the one or more optical paths in parallel, the one or more optical paths including one or more delay lines configured to generate one or more delay line signals, the one or more delay lines having one or more delay line lengths; and
- a combiner, the combiner configured to combine the one or more delay line signals from the one or more optical paths to generate the one or more non-uniform optic pulses.

8. The converter of claim 7, wherein the one or more delay line lengths are between 0 and $(2^N-1)\Delta T$.

9. The converter of claim 7, wherein the timing control sub-system comprises:
- a pseudo-random generator, the pseudo-random generator configured to generate a digital control code and provide the digital control code to the optical switch, the digital control code configured to control the optical switch.

10. The converter of claim 1, wherein the pulse capture assembly includes an integrate-and-dump circuit configured to capture the pulse amplitude of an electronic signal.

11. The converter of claim 1, further comprising:
- a timing recovery sub-system configured to determine a non-uniform timing signal.

12. The converter of claim 11, wherein the timing recovery sub-system includes an optical non-uniform clock recovery circuit, the optical non-uniform clock recovery circuit comprising:
- an optical splitter, the optical splitter configured to receive the one or more uniform optic pulses from the optical pulse source, the optical splitter coupled to one or more channels; and
- a coherent detection module, the coherent detection module configured to determine a maximum peak output for the one or more channels.

13. A non-uniform sampling photonic analog-to-digital converter comprising
- an optical pulse source, the optical pulse source configured to generate one or more uniform optic pulses;
- a serial switched delay line system, the serial switched delay line system comprising:
  - an inter-pulse timing modulation sub-system, the inter-pulse timing modulation sub-system configured to convert the one or more uniform optic pulses into one or more non-uniform optic pulses, the inter-pulse timing modulation sub-system comprising:
    - one or more fast optical switches; and
    - a timing control sub-system, the timing control sub-system configured to control the timing of the optical pulse source, the timing control sub-system including a pattern generator, the pattern generator configured to generate a digital control code and provide the digital control code to the one or more fast optical switches, the digital control code configured to control the one or more optical switches;
- an optical modulator, the optical modulator configured to modulate the one or more non-uniform optical pulses from the inter-pulse timing modulation sub-system;
- a photodetector, the photodetector configured to convert the one or more modulated non-uniform optic pulses into one or more electronic pulses;
- a pulse capture assembly, the pulse capture assembly configured to capture a pulse amplitude of the one or more electronic pulses and generate one or more sampled radio frequency output pulses; and
- a quantizer, the quantizer configured to quantize the one or more sampled radio frequency output pulses and generate one or more digital radio frequency output pulses.

14. The converter of claim 13, further comprising:
- a timing recovery sub-system configured to determine a non-uniform timing signal.

15. The converter of claim 14, wherein the timing recovery sub-system includes an optical non-uniform clock recovery circuit, the optical non-uniform clock recovery circuit comprising:

an optical splitter, the optical splitter configured to receive the one or more uniform optic pulses from the optical pulse source, the optical splitter coupled to one or more channels; and
a coherent detection module, the coherent detection module configured to determine a maximum peak output for the one or more channels.

\* \* \* \* \*